United States Patent [19]

Maegawa et al.

[11] Patent Number: 5,580,801
[45] Date of Patent: Dec. 3, 1996

[54] METHOD FOR PROCESSING A THIN FILM USING AN ENERGY BEAM

[75] Inventors: Shigeki Maegawa, Moriguchi; Tatsuo Yoshioka; Tetsuya Kawamura, both of Hirakata; Yutaka Miyata, Ikoma, all of Japan

[73] Assignee: Matsushita Electric Industrial Co., Ltd., Osaka, Japan

[21] Appl. No.: 298,440

[22] Filed: Aug. 30, 1994

[30] Foreign Application Priority Data

Aug. 31, 1993 [JP] Japan .................... 5-215522

[51] Int. Cl.⁶ .................... H01L 21/268; H01L 21/84
[52] U.S. Cl. .................... 437/40; 437/907; 437/174; 117/904; 148/DIG. 90; 156/651.1
[58] Field of Search .................... 156/651; 148/DIG. 71, 148/DIG. 90, DIG. 91, DIG. 93, DIG. 98; 437/907, 908, 233, 21, 40, 41, 173, 174; 117/8, 10, 904

[56] References Cited

U.S. PATENT DOCUMENTS

| | | |
|---|---|---|
| 4,409,724 | 10/1983 | Tasch et al. . |
| 4,585,492 | 4/1986 | Weinberg et al. .................. 148/DIG. 4 |
| 4,619,036 | 10/1986 | Havemann et al. .................... 437/908 |
| 4,646,424 | 3/1987 | Parks et al. .................... 437/40 |
| 4,661,167 | 4/1987 | Kusunoki et al. . |
| 4,892,613 | 1/1990 | Motai et al. .................... 156/651 |
| 4,933,296 | 6/1990 | Parks et al. .................... 437/40 |
| 4,933,298 | 6/1990 | Hasegawa .................... 437/40 |
| 4,960,719 | 10/1990 | Tanaka et al. .................... 437/40 |
| 4,963,503 | 10/1990 | Aoki et al. .................... 437/41 |
| 5,120,667 | 6/1992 | Tarui et al. .................... 437/21 |
| 5,262,654 | 11/1993 | Yamazaki . |
| 5,264,383 | 11/1993 | Young .................... 437/40 |
| 5,306,651 | 4/1994 | Masumo et al. .................... 437/40 |
| 5,308,998 | 5/1994 | Yamazaki et al. . |
| 5,326,712 | 7/1994 | Bae .................... 437/40 |
| 5,365,875 | 11/1994 | Asai et al. .................... 437/108 |

FOREIGN PATENT DOCUMENTS

| | | | |
|---|---|---|---|
| 2560436 | 8/1985 | France . | |
| 2-219238 | 8/1990 | Japan | .................... 437/21 |
| 2-219239 | 8/1990 | Japan | .................... 437/21 |
| 2-219240 | 8/1990 | Japan | .................... 437/21 |
| 2-219241 | 8/1990 | Japan | .................... 437/21 |

OTHER PUBLICATIONS

A. Ishizu et al., "An Active-Matrix LC Display Addressed by Re-Crystallized Poly-Si TFTS", *SID International Symposium: Digest of Technical Papers*, pp. 282–285 (1985).

T. I. Kamins et al., Solid St. Electronics 23(1980) 1037 ". . . Laser Annealed Insulators on Silicon".

D. L. Crosthwait et al., Laser & e-Beam Interactions /MRS Proc. (1980) 399, ". . . Laser Irradiation on Thermal Oxides of Si".

K. B. Kadyrakunov et al., Phys. Stat. Sol. A70, (1982)K15 ". . . Pulsed Annealing of Si–SiO₂ Structures".

*Primary Examiner*—Charles L. Bowers, Jr.
*Assistant Examiner*—Leon Radomsky
*Attorney, Agent, or Firm*—Ratner & Prestia

[57] ABSTRACT

A thin film on a substrate is patterned so as to include an area in which a thin film transistor is to be formed and an area of another patterned thin film or a semiconductor device, and so as to have a size larger than the total size of the areas. Next, the patterned thin film is annealed. After the annealing, a part of the inside area of the patterned thin film is patterned. The part of the thin film is used for forming a thin film transistor.

19 Claims, 5 Drawing Sheets

Patterning

Annealing

Patterning

Annealing

Patterning

Annealing

FIG. 7A  First patterning
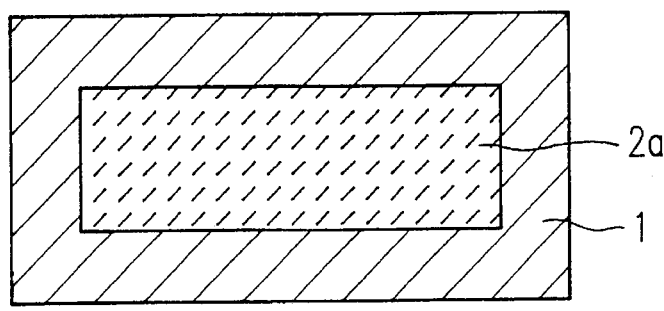
FIG. 7B
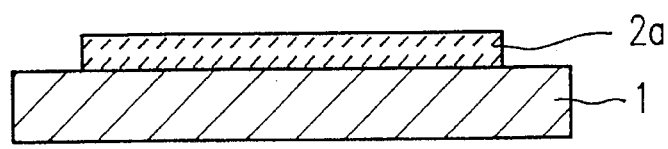
FIG. 8A  Annealing
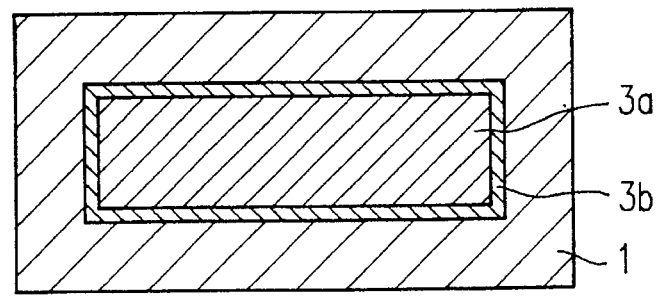
FIG. 8B
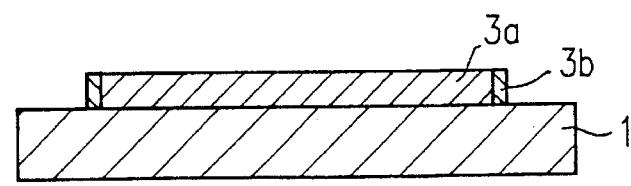
FIG. 9A  Second patterning
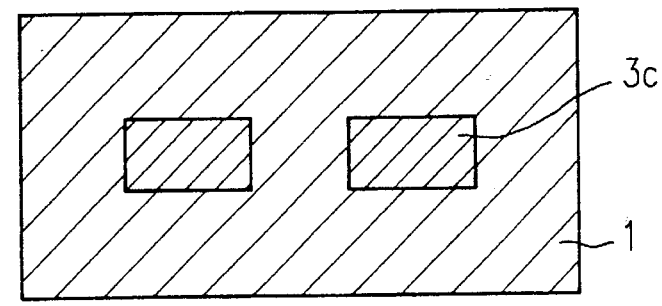
FIG. 9B
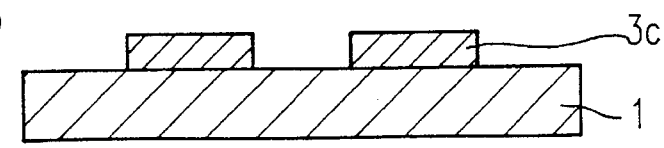

FIG. 10A  First patterning
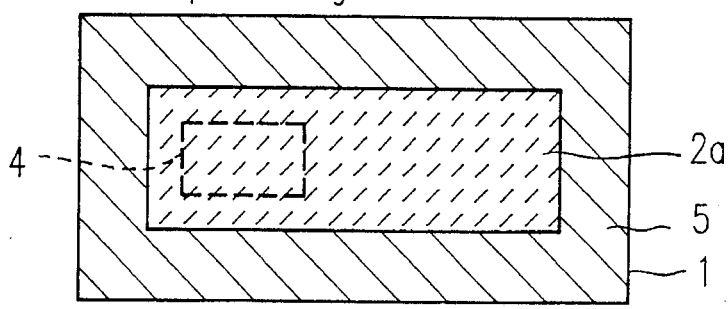
FIG. 10B
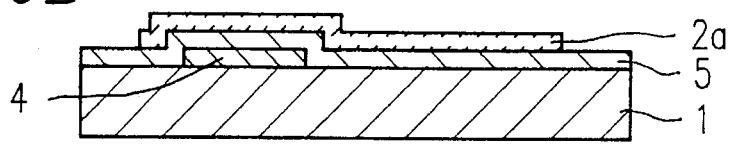
FIG. 11A  Annealing
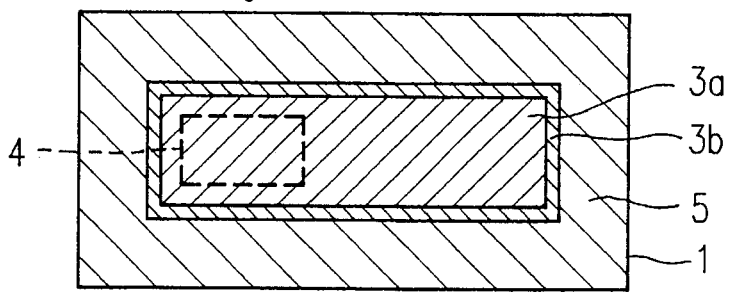
FIG. 11B
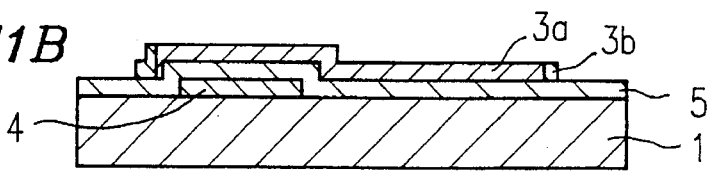
FIG. 12A  Second patterning
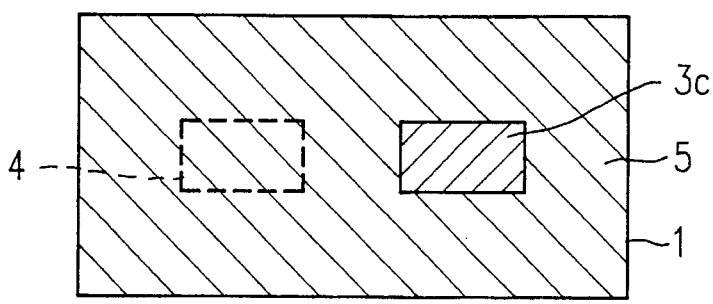
FIG. 12B
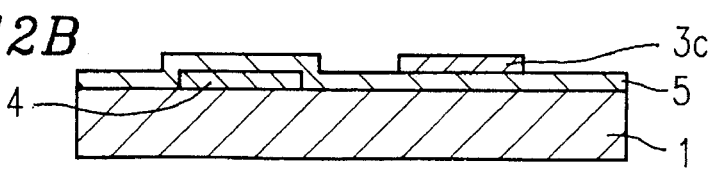

1

METHOD FOR PROCESSING A THIN FILM USING AN ENERGY BEAM

BACKGROUND OF THE INVENTION

1. Field of the Invention

The present invention relates to a method for processing a thin film. More particularly, the present invention relates to a thin-film processing method which is applied to the fabrication of a thin film transistor for a liquid crystal display, an image sensor, a static random access memory (SRAM), or the like.

2. Description of the Related Art

In recent years, as liquid crystal displays have higher definition and a larger size, an increase in production yield of a thin film transistor (hereinafter referred to as a TFT) used as the driving element is essentially required. This is because a driving section of the liquid crystal display includes a large number of TFTs. The production yield of TFTs largely depends on the uniformity of a semiconductor thin film which constitutes the TFTs, and especially on the uniformity of crystallinity. In order to increase the production yield of TFTs, it is very important to form a thin film with superior uniformity.

As a recent trend, the main semiconductor material of a TFT is being shifted from conventional amorphous silicon (a-Si) to polycrystalline silicon (poly-Si). When a thin film of poly-Si is to be formed, the key technique is the annealing (heat treatment) for changing a-Si to poly-Si. As to the annealing, excimer laser annealing which causes no damage to an inexpensive glass substrate having a low deforming point, and low-temperature annealing (at temperatures equal to or lower than about 600° C.) such as solid phase crystallization are considered as promising methods.

Hereinafter, a thin-film processing method used in a fabrication process of a conventional poly-Si TFT will be described. FIGS. 1A, 1B, 2A, and 2B are plan views of an area in which TFTs are to be formed and the cross-sectional views thereof in the course of the process steps in a prior art example A. FIGS. 3A, 3B, 4A, and 4B are plan views of an area in which TFTs are to be formed and the cross-sectional views thereof in course of the process steps in a prior art example B.

As is shown in FIGS. 1A, 1B, 2A, and 2B, in the prior art example A, the patterning of a semiconductor thin film on a substrate 1 is first performed, so as to form an area 2b in which a TFT is to be formed. Then, the area 2b is irradiated with an excimer laser beam for heating the area 2b. As a result, the area 2b is crystallized (annealed), so as to form an area 3c. Herein, the area 3c is used as a semiconductor layer for a TFT.

In the prior art example B shown in FIGS. 3A, 3B, 4A and 4B, a semiconductor thin film of a substrate 1 (in this case, the semiconductor thin film is formed over the entire surface of a semiconductor wafer excluding the edge peripheral portion of the wafer) is irradiated with an excimer laser beam, so as to form a crystallized semiconductor thin film 3. Next, the patterning of the semiconductor thin film 3 is performed, so as to form an area 3c.

FIGS. 5A, 5B, 6A, and 6B show a thin-film processing method in a prior art example C. In the prior art example C as shown in FIGS. 5A, 5B, 6A, and 6B, on a substrate 1 on which a patterned thin film or a semiconductor device 4 and a semiconductor thin film are formed, the patterning of the semiconductor thin film is performed, so as to form an area 2b in which a TFT is to be formed. Next, the excimer laser irradiation is performed, so as to form a crystallized area 3c.

The prior art example A has problems in that the desired device performance cannot be attained for TFTs and there exist large variations in device performance. This is because an inside portion 3a and an edge peripheral portion 3b of the area 3c in which a TFT is to be formed have a difference in crystallinity. In the excimer laser annealing step, the face of the edge peripheral portion of the semiconductor thin film pattern which is parallel to the substrate is in contact with a vacuum, a gas, or the like. Therefore, a difference in heat dissipation occurs between the inside portion and the edge peripheral portion of the semiconductor thin film pattern, and hence the crystallizing processes are different.

In the experiments conducted by the inventors of this invention, when the crystallization by annealing an a-Si thin film was performed in the excimer laser annealing step, the crystallinity in the peripheral portion having a width of about 2–3 μm measured from the edge of the thin film pattern was inferior to that of the inside portion of the thin film pattern. Accordingly, as a TFT is made in a smaller size, most of the semiconductor thin film pattern has inferior crystallinity. This causes the device performance of the TFT to be deteriorated. Moreover, it is difficult to regulate the portion with poor crystallinity by annealing conditions. This may cause variations in device performance.

The prior art example B can avoid the problem of non-uniformity in crystallinity between the inside portion 3a and the edge peripheral portion 3b of the semiconductor thin film pattern which arises in the prior art example A. However, in the prior art example B, the performance of the TFT may be deteriorated and variations in device performance may occur for other reasons. That is, the annealing is performed over the semiconductor thin film formed on substantially the entire face of the wafer with an excimer laser beam, so that the bow or expansion/shrinkage of the substrate affects the dimensional precision of the TFT.

In the prior art example B, it is difficult to adjust the positions of a device fabricating portion and a portion to which the annealing is actually performed, when the annealing is selectively performed to a portion of the semiconductor thin film. This is because there is no thin film pattern which can serve as a positioning reference.

In the prior art example C, the annealing step required for the fabrication of the TFT often adversely affects the patterned thin film or the semiconductor device 4. This is because when the annealing is performed to the semiconductor thin film with an excimer laser beam, the patterned thin film or the semiconductor device 4 is also irradiated with the excimer laser beam, so that the film may be peeled off and the semiconductor device performance may be deteriorated.

SUMMARY OF THE INVENTION

The method for processing a thin film of the invention includes: a first patterning step of patterning a thin film on a substrate; an annealing step of annealing the patterned thin film by using an energy beam; a second patterning step of patterning the thin film; and a step of forming a thin film device using the patterned thin film.

In one embodiment of the invention, in the first patterning step, the thin film is patterned so as to include a device forming area and to have a size larger than the device forming area.

In another embodiment of the invention, the second patterning step includes a step of removing an edge peripheral portion of the thin film which is patterned in the first patterning step, the edge peripheral portion having a width of 1 μm or more measured from the edge thereof.

In another embodiment of the invention, the thin film is an Si thin film. The Si thin film may be crystallized in the annealing step.

In another embodiment of the invention, the Si thin film may be an amorphous Si thin film, a polycrystalline Si thin film, or an insulating film.

In another embodiment of the invention, the annealing step utilizes a laser beam as the energy beam. The laser beam may be an excimer laser beam.

According to another aspect of the invention, the method for processing a thin film includes: a step of forming a patterned first thin film on a substrate; a step of forming a second thin film on the substrate; a first patterning step of patterning the second thin film so as to cover the patterned first thin film; an annealing step of annealing the patterned second thin film; a second patterning step of patterning the second thin film; and a step of forming a thin film device using the patterned second thin film.

In one embodiment of the invention, in the first patterning step, the second thin film is patterned so as to include a device forming area and to have a size larger than the device forming area.

In another embodiment of the invention, the second patterning step includes a step of removing an edge peripheral portion of the second thin film which is patterned in the first patterning step, the edge peripheral portion having a width of 1 μm or more measured from the edge thereof.

In another embodiment of the invention, the second thin film is an Si thin film. The Si thin film may be an amorphous Si thin film, a polycrystalline Si thin film, or an insulating film.

In another embodiment of the invention, the annealing step utilizes a laser beam. The laser beam may be an excimer laser beam.

In another embodiment of the invention, the patterned first thin film is an ITO thin film.

In another embodiment of the invention, the thin film device is a MOSFET.

According to another aspect of the invention, the method for processing a thin film includes: a step of forming a semiconductor device on a substrate; a step of forming a thin film on the substrate; a first patterning step of patterning the thin film so as to cover the semiconductor device; an annealing step of annealing the patterned thin film; a second patterning step of patterning the thin film; and a step of forming a thin film device using the patterned thin film.

In one embodiment of the invention, in the first patterning step, the thin film is patterned so as to include a device forming area and to have a size larger than the device forming area.

In another embodiment of the invention, the second patterning step includes a step of removing an edge peripheral portion of the thin film which is patterned in the first patterning step, the edge peripheral portion having a width of 1 μm or more measured from the edge thereof.

In another embodiment of the invention, the thin film is an Si thin film. The Si thin film may be an amorphous Si thin film, a polycrystalline Si thin film, or an insulating film.

In another embodiment of the invention, the annealing step utilizes a laser beam. The laser beam may be an excimer laser beam.

In another embodiment of the invention, the semiconductor device is a MOSFET.

Thus, the invention described herein makes possible the advantages of (1) providing a thin-film processing method for suppressing variations in performance of TFTs, (2) providing a thin-film processing method for minimizing damage in a semiconductor thin film which may cause the performance of TFTs to be deteriorated, (3) providing a thin-film processing method for precisely performing partial annealing, and (4) providing a thin-film processing method in which a semiconductor thin film is annealed without causing any damage to a patterned thin film or a semiconductor device due to the annealing.

These and other advantages of the present invention will become apparent to those skilled in the art upon reading and understanding the following detailed description with reference to the accompanying figures.

BRIEF DESCRIPTION OF THE DRAWINGS

FIGS. 7A and 7B are a partial plan view and the cross-sectional view thereof, respectively, for illustrating a step in a thin-film processing method in a first example according to the invention.

FIGS. 8A and 8B are a partial plan view and the cross-sectional view thereof, respectively, for illustrating a step in a thin-film processing method in the first example according to the invention.

FIGS. 9A and 9B are a partial plan view and the cross-sectional view thereof, respectively, for illustrating a step in a thin-film processing method in the first example according to the invention.

FIGS. 10A and 10B are a partial plan view and the cross-sectional view thereof, respectively, for illustrating a step in a thin-film processing method in a second example according to the invention.

FIGS. 11A and 11B are a partial plan view and the cross-sectional view thereof, respectively, for illustrating a step in a thin-film processing method in the second example according to the invention.

FIGS. 12A and 12B are a partial plan view and the cross-sectional view thereof, respectively, for illustrating a step in a thin-film processing method in the second example according to the invention.

DESCRIPTION OF THE PREFERRED EMBODIMENTS

EXAMPLE 1

Figure 1A:
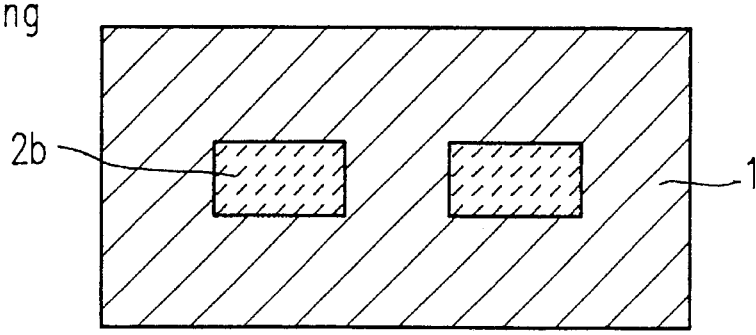
FIGS. 1A and 1B are a partial plan view and the cross-sectional view thereof, respectively, for illustrating a step in a thin-film processing method in a prior art example A.
Figure 1B:
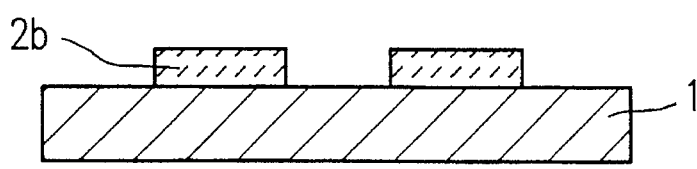
Figure 2A:
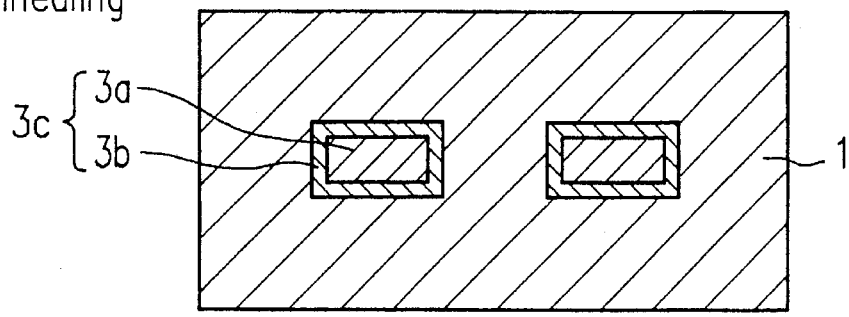
FIGS. 2A and 2B are a partial plan view and the cross-sectional view thereof, respectively, for illustrating a step in a thin-film processing method in the prior art example A.
Figure 2B:
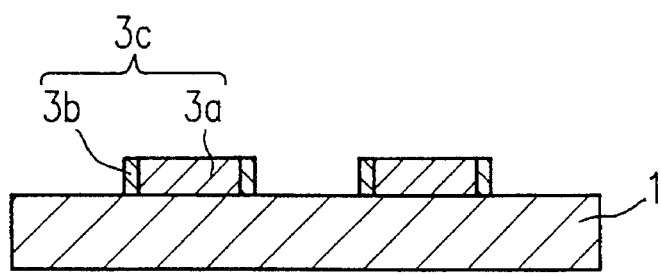
Figure 3A:
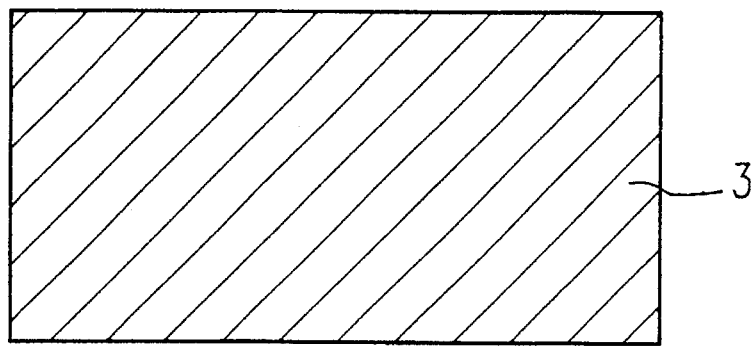
FIGS. 3A and 3B are a partial plan view and the cross-sectional view thereof, respectively, for illustrating a step in a thin-film processing method in a prior art example B.
Figure 3B:
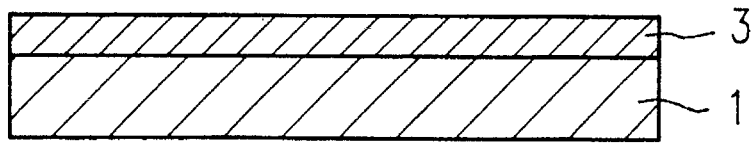
Figure 4A:
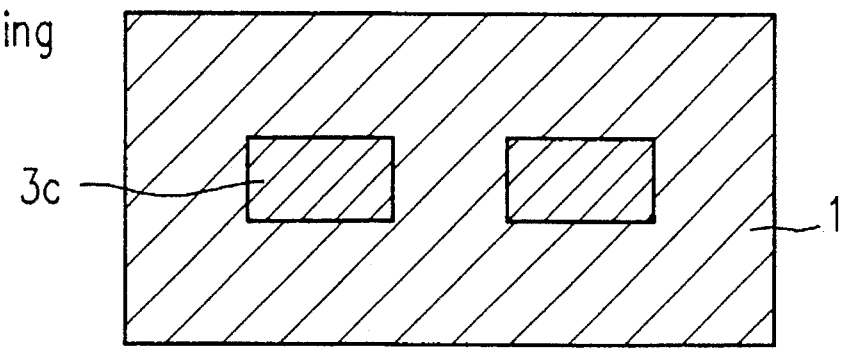
FIGS. 4A and 4B are a partial plan view and the cross-sectional view thereof, respectively, for illustrating a step in a thin-film processing method in the prior art example B.
Figure 4B:
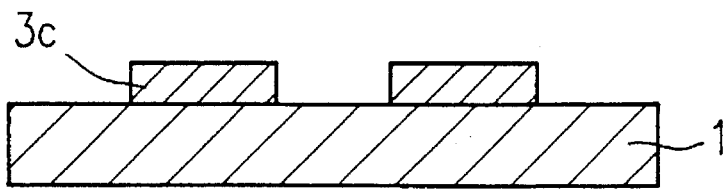
Figure 5A:
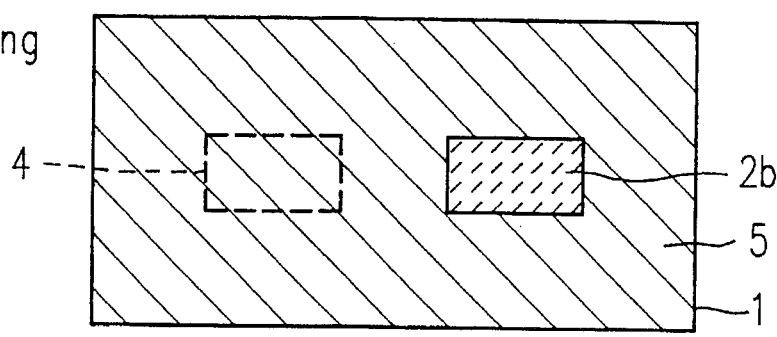
FIGS. 5A and 5B are a partial plan view and the cross-sectional view thereof, respectively, for illustrating a step in a thin-film processing method in a prior art example C.
Figure 5B:
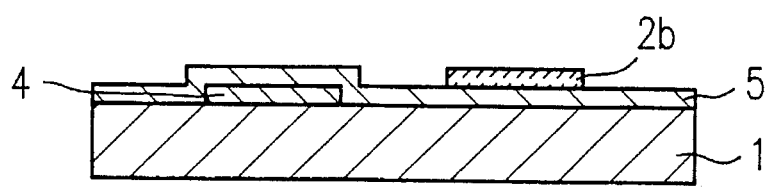
Figure 6A:
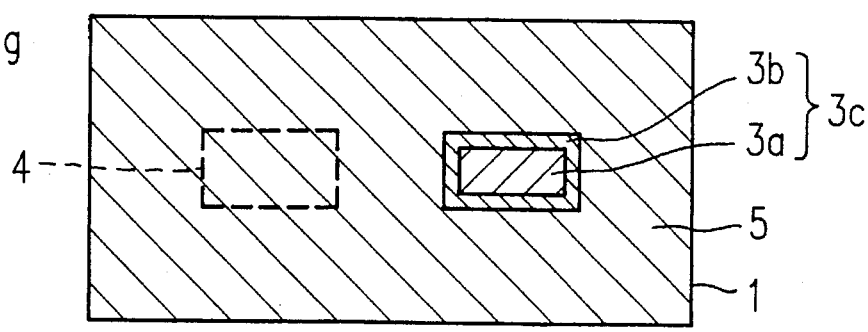
FIGS. 6A and 6B are a partial plan view and the cross-sectional view thereof, respectively, for illustrating a step in a thin-film processing method in the prior art example C.
Figure 6B:
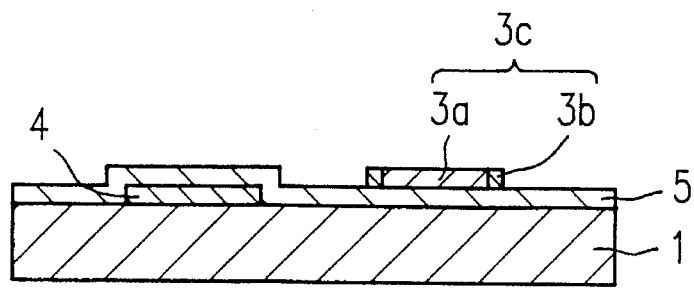

By referring to FIGS. 7A, 7B, 8A, 8B, 9A, and 9B, a first example of a thin-film processing method according to the invention will be described. In this example, a method for processing a semiconductor thin film used in a TFT, and especially an a-Si thin film is described.

First, as shown in FIGS. 7A and 7B, after a semiconductor thin film (thickness: 10 nm to 1 μm) made of an a-Si thin film or the like is deposited on a substrate 1, a first patterning step is performed. In this example, a glass substrate is used as the substrate 1. In the first patterning step, the semiconductor thin film is patterned into a semiconductor thin film pattern 2a. In FIGS. 7A and 7B, only one thin film pattern 2a is shown. It is appreciated that a plurality of semiconductor thin film patterns may be simultaneously formed on a single substrate 1. The first patterning step includes known lithography and etching processes. The thin film pattern 2a includes two areas in which TFTs are to be formed (areas indicated by the reference numeral 3c in FIGS. 9A and 9B), and has a size larger than the total size of the two areas. If each of the areas 3c in FIGS. 9A and 9B has a size, for example, of 5 μm×10 μm, it is preferred that the semiconductor thin film pattern 2a is typically designed to have a size larger than 20 μm×40 μm. However, these sizes and the number of areas 3c included in one semiconductor thin film pattern 2a can be desirably selected.

In an annealing step, the semiconductor thin film pattern 2a is irradiated with an excimer laser beam, so as to crystallize the semiconductor thin film pattern 2a. Thus, thin film patterns 3a and 3b in crystalline state are formed from the a-Si semiconductor thin film pattern 2a (FIGS. 8A and 8B). Exemplary excimer laser annealing conditions are as follows: the energy density per pulse is 400 mJ/cm$^2$ and the irradiation area is 1 cm×1 cm. At this time, the temperature of the central portion of the semiconductor thin film pattern 2a rises to 1000° C. or more.

After the areas 3c are formed in the crystallized thin film pattern inside portion 3a through a second patterning step, TFTs are formed using the respective areas 3c. The second patterning step also includes the known lithography and etching processes. The respective areas 3c are used as channel regions, and source/drain regions of TFTs.

According to this example, the heat generated by the annealing flows through the semiconductor thin film pattern 2a with higher thermal conductivity than the substrate 1. There arises a difference in heat dissipation between the edge peripheral portion and the central portion of the semiconductor thin film pattern 2a, so that a difference in crystallinity is generated between the inside portion 3a and the edge peripheral portion 3b of the semiconductor thin film pattern after the annealing. However, the areas 3c are formed from the central portion in which the crystallinity is uniform of the thin film pattern inside portion 3a, and the edge peripheral portion 3b is removed. Preferably, the edge peripheral portion 3b has a width of 1 μm or more measured from the edge thereof. As a result, TFTs are formed using the areas 3c which have uniform crystallinity, so that TFTs having stable and substantially equal performance can be obtained.

As to the bow and expansion/shrinkage of the substrate during the annealing step, the stress is distributed for each semiconductor thin film pattern 2a having a larger size than the area 3c in which a TFT is to be formed. Accordingly, the influence on the performance of TFT can be reduced.

When a portion of the semiconductor thin film is to be selectively annealed, the semiconductor thin film pattern 2a which is formed in the first patterning step or the edge portion thereof can be used as a mark for the mask alignment. Accordingly, it is possible to precisely anneal the portion to be annealed.

In this example, the case where an a-Si thin film is used has been described. Alternatively, another semiconductor thin film such as a poly-Si thin film may be used. When a poly-Si thin film is used, it is unnecessary to completely recrystallize the poly-Si film in the annealing step. If only the surface of the poly-Si film is recrystallized, the electric characteristics of the poly-Si film are enhanced.

Instead of the semiconductor thin film, an insulator thin film such as an SiN thin film may be used. The insulation property of the insulator film and the property as the passivation film are poor when the insulator film is deposited at a temperature of about 600° C. or less, as compared with the case where the insulator film is deposited at a higher temperature. If the processing method of the invention is performed after the deposition at 600° C. or less, the insulation property of the insulator film is improved. The use of such an insulator film in, for example, a TFT improves the device characteristics of the TFT. If the insulator film is deposited at a temperature higher than 600° C., the glass substrate may be deformed.

EXAMPLE 2

By referring to FIGS. 10A, 10B, 11A, 11B, 12A, and 12B, a second example of a thin-film processing method according to the invention will be described.

First, as shown in FIGS. 10A and 10B, after a patterned thin film 4 or a semiconductor device is formed on a substrate 1, an insulator thin film 5 is deposited on the substrate 1. When the thin-film processing method of this example is applied to the production of an active matrix type liquid crystal display, the patterned thin film may be, for example, a transparent pixel electrode formed of ITO. After a semiconductor thin film (thickness: 10 nm to 1 μm) such as an a-Si thin film is deposited on the substrate 1, the semiconductor thin film is patterned into a semiconductor thin film pattern 2a by a first patterning step. In FIGS. 10A and 10B, only one thin film pattern 2a is shown. It is appreciated that a plurality of semiconductor thin film patterns may be simultaneously formed on a single substrate 1. The first patterning process includes known lithography and etching processes. The thin film pattern 2a includes the patterned thin film 4 and an area in which a TFT is to be formed (an area indicated by the reference numeral 3c in FIGS. 12A and 12B), and has a size larger than the total size of the thin film 4 and the area 3c. If each of the area 3c and the thin film 4 in FIGS. 12A and 12B has a size, for example, of 5 μm×10 μm, it is preferred that the semiconductor thin film pattern 2a is typically designed to have a size larger than 20 μm×40 μm. However, these sizes and the number of areas 3c included in one semiconductor thin film pattern 2a can be desirably selected.

In an annealing step, the semiconductor thin film pattern 2a is irradiated with an excimer laser beam. The annealing conditions are the same as those in the first example. As the result of the annealing, the semiconductor thin film pattern 2a is crystallized (annealed). Thus, thin film patterns 3a and 3b in crystalline state are formed from the a-Si semiconductor thin film pattern 2a (FIGS. 11A and 11B).

After the area 3c is formed in the crystallized thin film pattern inside portion 3a through a second patterning step, a TFT is formed using the area 3c. The second patterning step also includes known lithography and etching processes.

In this example, most of the laser light for irradiation is absorbed by or reflected from the semiconductor thin film 2a, and does not reach the underlying layer. Accordingly, it is possible to reduce the influence on the underlying patterned thin film or semiconductor device. For example, in an ITO electrode used in a liquid crystal display, it is possible to prevent a film from being peeled off due to the laser irradiation, which is effective in view of the producibility. Moreover, it is possible to attain the effects of both the first and second examples. Thus, transistors of high performance can be stably fabricated.

In this example, as the patterned thin film 4, instead of the ITO pixel electrode, a thin film or a semiconductor device formed of a material which is easily adversely affected by the annealing can be used. For example, the thin film 4 may be a MOSFET for SRAM.

In the first and second examples, the annealing is performed using excimer laser. Other types of laser or any energy beam such as an electron beam can attain the same effects. Alternatively, solid phase crystallization using a heater can attain the same effects.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for processing a thin film comprising:

a step of forming a patterned first thin film on a substrate;

a step of forming a second thin film on the substrate;

a first patterning step of patterning the second thin film so as to cover the patterned first thin film, the patterned second thin film including a device forming area in a region where the patterned first thin film does not exist;

an annealing step of annealing the patterned second thin film by using an energy beam;

a second patterning step of patterning the second thin film, wherein the second patterning step includes a step of removing an edge peripheral portion of the second thin film and a step of removing the portion of the second thin film that overlies the first thin film; and a step of forming a thin film device using the device forming area.

2. A method for processing a thin film comprising:

a step of forming a patterned first thin film on a substrate;

a step of forming a second thin film on the substrate;

a first patterning step of patterning the second fixing film so as to cover the patterned first thin film, the patterned second thin film including a device forming area in a region where the patterned first thin film does not exist;

an annealing step of annealing the patterned second thin film by using an energy beam wherein most of the energy beam is absorbed in or reflected from the second thin film, and does not reach the first thin film;

a second patterning step of patterning the second thin film, wherein the second patterning step includes a step of removing an edge peripheral portion of the second thin film which is patterned in the first patterning step, the edge peripheral portion having a width of 1 µm or more measured from the edge thereof and a step of removing the portion of the second thin film that overlies the first thin film; and a step of forming a thin film device using the device forming area.

3. A method for processing a thin film according to claim 2, wherein the second thin film is an Si thin film.

4. A method for processing a thin film according to claim 3, wherein the Si thin film is an amorphous Si thin film.

5. A method for processing a thin film according to claim 3, wherein the Si thin film is a polycrystalline Si thin film.

6. A method for processing a thin film according to claim 2, wherein the second thin film is an insulating film.

7. A method for processing a thin film according to claim 2, wherein the annealing step utilizes a laser beam as the energy beam.

8. A method for processing a thin film according to claim 7, wherein the laser beam is an excimer laser beam.

9. A method for processing a thin film according to claim 2, wherein the thin film device is a MOSFET.

10. A method for processing a thin film comprising:

a step of forming a patterned first thin film on a substrate, wherein the patterned first thin film is a ITO thin film;

a step of forming a second first film on the substrate;

a first patterning step of patterning the second thin film so as to cover the patterned first thin film, the patterned second thin film includes a device forming area in a region where the patterned first thin film does not exist;

an annealing step of annealing the patterned second thin film by using an energy beam wherein most of the energy beam is absorbed in or reflected from the second thin film, and does not reach the first thin film;

a second patterning step of patterning the second thin film, wherein the second patterning step includes a step of removing an edge peripheral portion of the second thin film which is patterned in the first patterning step, the edge peripheral portion having a width of 1 µm or more measured from the edge thereof and a step of removing the portion of the second thin film that overlies the first thin film; and a step of forming a thin film device using the device forming area.

11. A method for processing a thin film comprising:

a step of forming a semiconductor device on a substrate;

a step of forming a thin film on the substrate;

a first patterning step of patterning the thin film so as to cover the semiconductor device, the patterned thin film including a device forming area in a region where the semiconductor device does not exist;

an annealing step of annealing the patterned thin film by using an energy beam;

a second patterning step of patterning the thin film, wherein the second patterning step includes a step of removing an edge peripheral portion of the thin film which is patterned in the first patterning step; and a step of forming a thin film device using the device forming area.

12. A method for processing a thin film comprising:

a step of forming a semiconductor device on a substrate;

a step of forming a thin film on the substrate;

a first patterning step of patterning the thin film so as to cover the semiconductor device, the patterned thin film including a device forming area in a region where the semiconductor device does not exist;

an annealing step of annealing the patterned thin film by using an energy beam;

a second patterning step of patterning the thin film, wherein the second patterning step includes a step of removing an edge peripheral portion of the thin film which is patterned in the first patterning step, the edge peripheral portion having a width of 1 µm or more measured from the edge thereof; and a step of forming a thin film device using the device forming area.

13. A method for processing a thin film according to claim 12, wherein the thin film is an Si thin film.

14. A method for processing a thin film according to claim 13, wherein the Si thin film is an amorphous Si thin film.

15. A method for processing a thin film according to claim 13, wherein the Si thin film is a polycrystalline Si thin film.

16. A method for processing a thin film according to claim 12, wherein the thin film is an insulating film.

17. A method for processing a thin film according to claim 12, wherein the annealing step utilizes a laser beam as the energy beam.

18. A method for processing a thin film according to claim 17, wherein the laser beam is an excimer laser beam.

19. A method for processing a thin film according to claim 12, wherein the semiconductor device is a MOSFET.

* * * * *

UNITED STATES PATENT AND TRADE MARK OFFICE
CERTIFICATE OF CORRECTION

PATENT NO. : 5,580,801
DATED : December 3, 1996
INVENTOR(S) : Maegawa et al.

It is certified that error appears in the above-identified patent and that said Letters Patent is hereby corrected as shown below:

Column 7, line 47, delete "fixing" and insert therefor --thin--.

Column 8, line 17, delete "first" and insert therefor --thin--.

Column 8, line 20, delete "m" and insert therefor --in--.

Signed and Sealed this

Eighth Day of April, 1997

*Attest:*

BRUCE LEHMAN

*Attesting Officer*  Commissioner of Patents and Trademarks